(12) United States Patent
Griswold et al.

(10) Patent No.: US 8,717,023 B2
(45) Date of Patent: May 6, 2014

(54) RELAXOMETRY QUANTIFICATION SELF-JUSTIFICATION FITTING

(76) Inventors: Mark Griswold, Shaker Heights, OH (US); Dan Ma, Cleveland Heights, OH (US); Kecheng Liu, Solon, OH (US)

(*) Notice: Subject to any disclaimer, the term of this patent is extended or adjusted under 35 U.S.C. 154(b) by 403 days.

(21) Appl. No.: 13/236,795

(22) Filed: Sep. 20, 2011

(65) Prior Publication Data
US 2012/0268123 A1 Oct. 25, 2012

Related U.S. Application Data

(60) Provisional application No. 61/477,850, filed on Apr. 21, 2011.

(51) Int. Cl.
*G01V 3/00* (2006.01)
(52) U.S. Cl.
USPC .......................................... 324/309; 324/307
(58) Field of Classification Search
USPC .......................... 324/300–322; 600/409–445
See application file for complete search history.

(56) References Cited

U.S. PATENT DOCUMENTS

| 8,155,888 B2* | 4/2012 | Dobson et al. | 702/19 |
| 8,374,974 B2* | 2/2013 | Chen et al. | 706/8 |
| 2010/0261882 A1* | 10/2010 | Doboson et al. | 530/350 |

* cited by examiner

*Primary Examiner* — Brij Shrivastav

(57) ABSTRACT

Apparatus, methods, and other embodiments associated with self-justification fitting for magnetic resonance imaging (MRI) relaxation parameter quantification are described. One example nuclear magnetic resonance (NMR) apparatus includes a self-justification fitting logic configured to selectively include and exclude data points from a set of data points associated with NMR signals based, at least in part, on their impact on a fit attribute (e.g., standard deviation). In one embodiment, the self-justification is configured to select a subset of data points from the set of data points as a function of values for a fit attribute computed from fitting at least two different subsets of data points from the set of data points to a known NMR signal evolution.

37 Claims, 11 Drawing Sheets

TE
(A) T2 Decay Curves

TE
(B) T2 Decay Curves

TE
(C) T2 Decay Curves

US 8,717,023 B2

RELAXOMETRY QUANTIFICATION SELF-JUSTIFICATION FITTING

PRIORITY CLAIM

This application claims the benefit of U.S. Provisional Application 61/477,850 filed Apr. 21, 2011, titled Self Justification Fitting of Relaxometry Quantification, by the same inventors.

BACKGROUND

T1 and T2 quantification have previously been used in some clinical diagnoses (e.g., evaluation of musculoskeletal cartilage, evaluation of cardiac function) with some success. Unlike conventional qualitative image-based approaches, a quantification based diagnosis relies on objective relaxation parameter quantification. Conventional magnetic resonance imaging (MRI) is typically configured to produce qualitative data useful for providing qualitative results (e.g., images) with various weightings or contrasts that highlight a particular parameter (e.g., T1 relaxation, T2 relaxation). This conventional approach is constrained by the fact that conventional MRI is focused mainly on producing qualitative images. Constraining nuclear magnetic resonance (NMR) to techniques that facilitate producing images may not be appropriate in some cases. For example, an image based approach may not be appropriate when a goal for an NMR inquiry is to make a diagnosis based on quantified relaxation parameters. Instead, quantitative results that can be acquired more quickly may be sufficient and/or desired.

A conventional MRI acquisition involves numerous repetitions of prepare/wait/acquire pulse sequences. For example, a first pulse sequence may be applied a large number of times to acquire T1 weighted signals for all voxels in a volume of interest (RoI) and then a second pulse sequence may be applied a large number of times to acquire T2 weighted signals for all the voxels in the RoI. Registering (e.g., aligning) the signals from these two acquisitions to make a readable image may be difficult. Regardless of how lengthy and how difficult the process, given enough time, this repetitive application of prepare/wait/acquire pulse sequences can produce excellent and valuable images from which a diagnosis can be made.

Conventional images produced by conventional systems are typically viewed by a radiologist and/or surgeon who interprets the qualitative images for specific condition and/or disease signatures. Diagnosis may involve examining multiple image types (e.g., T1-weighted, T2-weighted) acquired in multiple imaging planes. Making a diagnosis by examining qualitative images may require particular skill to be able to assess changes from session to session, from machine to machine, and from machine configuration to machine configuration. Thus, qualitative images are only as good as the image interpreter and all image based (e.g., qualitative) diagnoses end up being subjective. Diagnoses based on qualitative images also depend on the availability of a skilled and/or certified person to make the diagnosis. This may be a challenge in certain environments. For example, while some rural or remote facilities may be able to house an MRI apparatus, there may be no radiologist available to examine the images acquired.

Although conventional MRI has served the clinical community well for many years, in some cases objectivity may be desired over subjectivity, and automation may be desired over in-person diagnosis. Thus, T1, T2, spin density, off-resonance, diffusion weighted, and other relaxation parameter quantifications have recently become more relevant due, for example, to the availability of new techniques and new pulse sequences. Unfortunately, in a quantitative approach, even a slight system imperfection may yield a substantial impact on quantified mapping values. While this impact may not be apparent on qualitative images and may not affect conventional qualitative diagnosis, the impact on quantification based diagnoses may be significant.

Due to ongoing technical limitations, system performance is typically imperfect at some level. In particular, for multi-echo readouts, radio frequency (RF) imperfections may introduce echo signal errors due, for example, to an imperfect slice profile. By way of illustration, the second echo signal in a multi-echo readout may be too high due to the stimulated echo effect. Additionally, the stimulated echo effect may impact more than just the second echo signal, particularly for species with long relaxation times.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
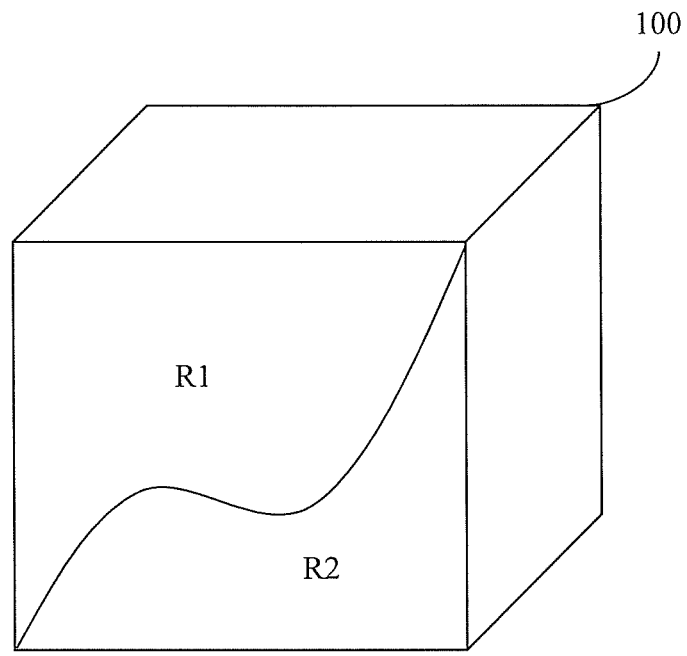
FIG. 1 illustrates a volume that contains two resonant species.

Example apparatus and methods concern self-justification fitting for relaxometry quantification. In one embodiment, self-justification fitting facilitates improving the accuracy of quantified values (e.g., T1, T2, off-resonance, diffusion weighted, spin density) which in turn facilitates improving the reliability of objective data upon which a characterization and/or diagnosis may be made.

In one embodiment, example apparatus and methods perform self-justification fitting that involves predicting measurable quantification ranges. Predicting and/or analyzing measurable quantification ranges facilitates ensuring acceptable error ranges for quantified values. Additionally, predicting and/or analyzing measurable quantification ranges facilitates determining whether additional (e.g., replacement) data should be acquired. Establishing and/or understanding measurable quantification ranges and/or error ranges may be desirable before performing or relying on a clinical diagnosis. For example, if a quantification range and error range indicate that only data of dubious quality is available, then it may not make sense to make a diagnosis. Instead, it may make sense to acquire more data by, for example, exciting the object again and acquiring new data.

A noise-free ideal system that used at least two points in an echo train to calculate T2 might yield an ideal curve having a zero standard deviation. Unfortunately, noise-free ideal systems that produce ideal curves remain elusive. Thus, example apparatus and methods provide self-justification that facilitates accounting for noise in non-ideal quantification based systems. In actual, non-ideal systems, an echo train with even one compromised point may yield results that significantly deviate from the ideal curve. The one compromised point may be the result of noise or some other system imperfection. If the one compromised point is included in the fit to the ideal curve, the standard deviation increases. Similarly, including a compromised point may negatively impact other fitting attributes. Since this fitting process is normally non-linear, errors in single points could have particularly large impact on the standard deviation of the output. By selectively excluding some points from a fit to an ideal curve, fitting attributes including standard deviation may be improved. In one embodiment, points may be excluded until a fitting attribute (e.g., standard deviation) falls within an acceptable range. In another embodiment, points may be effectively excluded or otherwise minimized by using a weighting factor for outlying points. The weighting factor may be a function of, for example, an effect on standard deviation.

By way of illustration, consider a data set having N members. The data set may have been acquired for a quantification process by a quantification configured NMR apparatus. The N members may represent, for example, data associated with different echoes in a multi-echo train. It is possible, even likely, that one or more of the N members may be undesirable data points. For example, a data point may have been compromised by the stimulated echo effect. Example apparatus and methods may identify and remove or otherwise minimize the effect of compromised data based on the effect on a fit that the compromised data point produces.

To find data points to include and to exclude, where excluding can be accomplished either by actually removing the data point or through the use of a weighting factor that minimizes or removes the effect of the data point. Example apparatus and methods may fit curves produced from different subsets of the N points and analyze a fitting parameter (e.g., standard deviation) associated with the fit achieved for the subset. While standard deviation is described, one skilled in the art will appreciate that other fitting parameters may be analyzed. In one embodiment, pre-determined subsets that provide useful intersections and isolations of data points may be analyzed to identify which data point(s), if any, are most likely contributing to fitting parameter errors. In one embodiment, the multiple pre-determined subsets may be analyzed in parallel by separate processors and/or processes. In another example, rather than using pre-determined subsets, ad-hoc subsets may be examined starting from either an optimistic or a pessimistic point of view.

Using an optimistic point of view, an approach may start big and subtract and thus the first subset analyzed will be the complete set. If the fitting parameter is acceptable (e.g., falls within a desired error range), then computation may be complete. If the fitting parameter is unacceptable (e.g., falls outside a desired range), then the computations may continue. If computations continue, then the optimistic approach may drop or diminish one data point or a small number of data points in an attempt to achieve a fit with acceptable fitting parameters. Processing may continue until an acceptable fit is achieved or until the possible combinations are exhausted.

Using a pessimistic point of view, an approach may start small and add points and thus the first subset analyzed may be a minimal set that contains just enough data points for valid analysis. Different minimal sets may be examined in parallel to identify promising data sets and not so promising data sets. If a minimal subset yields an acceptable fit, then additional points may be added to the minimal set. If a minimal subset does not yield an acceptable fit, then a different minimal set may be employed. Additionally, if a minimal subset does not yield an acceptable fit then the minimal subset may be partitioned into different subsets that can be analyzed separately to identify which point(s) are contributing to the unacceptable fit.

If an acceptable fit is found, then points may be added until the growing subset no longer provides an acceptable fit and/or until the growing subset has reached a desired size. If an augmented minimal set subsequently yields an unacceptable fit, then the point(s) added to the set that caused the fit to no longer be acceptable may be marked as undesirable data points and excluded from subsequent analyses. In one embodiment, in an attempt to continue to grow the growing subset, different points may be added to the growing subset that had the undesirable data point removed. In another embodiment, as soon as a growing subset yields an unacceptable fit the offending point may be removed and the subset used at its previous state.

More generally, combinations of less than all N points in a multi-echo echo train can be analyzed to facilitate identifying and then excluding potentially unacceptable and/or undesirable points. Therefore, example apparatus and methods may calculate the fit for different combinations of points in the data set. In one embodiment, combinations having acceptable standard deviations may be identified and then subsequently utilized for quantification. In another embodiment, a pre-determined number of combinations may be analyzed and the combination having the minimum standard deviation may be identified and selected for quantification. Thus, example apparatus and methods may detect and exclude undesirable points to reduce their impact on quantification which may in turn improve the reliability of the fitted results. In one embodiment, multiple different combinations may be computed in parallel and a "winner" combination selected from the parallel results.

Figure 3:
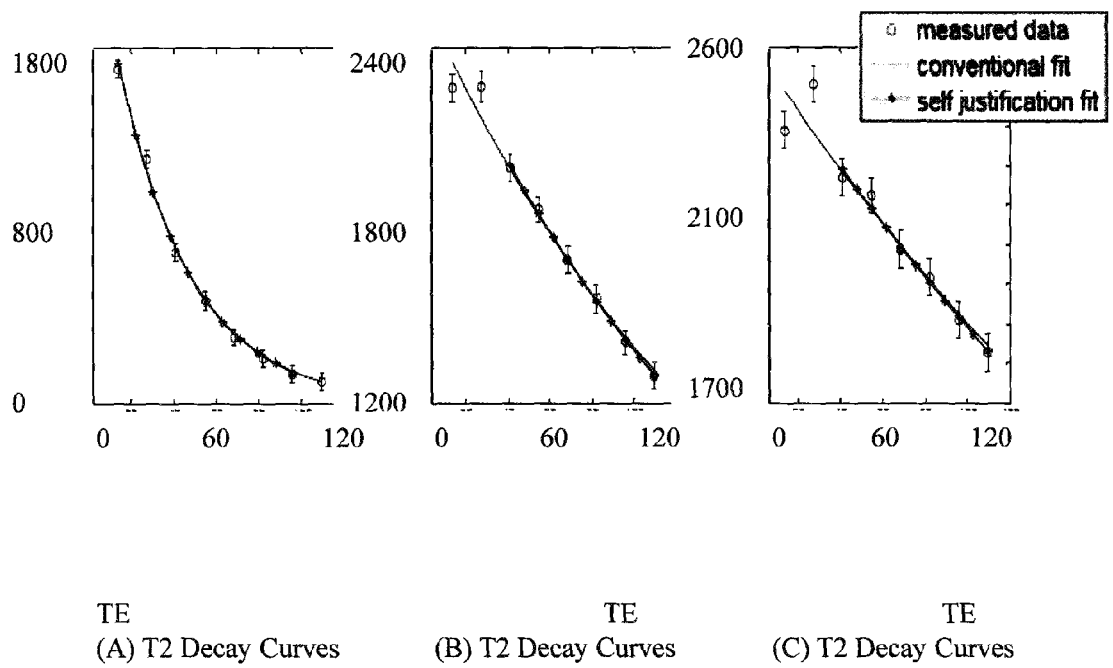
FIG. 3 illustrates decay curves associated with conventional fitting processes and illustrates decay curves associated with example self-justification fitting processes.

FIG. 3 shows the measured and fitted T2 decay curves from three species with different T2 values. FIG. 3 compares conventional fitting results where all echoes are included for a fit with the results from example self-justification fitting apparatus and methods where potentially less than all echoes are included. Portion A of FIG. 3 illustrates self justification fitting results for T2=32.8/33.2 ms. Portion B illustrates self justification fitting results for T2=171.2/159.0 ms. Portion C illustrates self justification fitting results for T2=954.8/710.3 ms. Note the significantly higher deviations illustrated for the higher T2 values. The significant deviations are explained by the non-ideal RF performance having more influence on species with longer T2. Thus, differences between conventionally computed curves and curves produced by example self-justification apparatus and methods are even more noticeable with large T2 values.

In one embodiment, an echo signal that is imperfect may still be used for a fit rather than ignored. For example, echo signals that yield a minor increase in standard deviation may be employed even if those echo signals do not produce the minimum standard deviation. In one embodiment, a balance is struck between maintaining the most data points possible while removing the most compromised data points so that an acceptable fit and a valid fit may be achieved. An acceptable fit may be a fit whose standard deviation is in a desired range. A valid fit may be a fit that is based on at least a threshold number of points. This balance facilitates supporting a conclusion about a curve fit that was achieved using less than all the available data. This balance may be sought because in some situations a fit based on a larger number (e.g., 16) of data points may be considered more diagnostically relevant and appropriate than a fit based on a smaller number (e.g., 4) of data points. Thus, in one example, points may be weighted based, for example, on their error or how they contribute to standard deviation.

Data points may be included or excluded based on whether their inclusion or exclusion enhances or degrades fit attributes (e.g., standard deviation). Points may be included so long as the resulting fit maintains an acceptable error range. Points may be excluded when they yield an unacceptable fit. The acceptability of an error range may in turn depend on factors including, but not limited to, the amount of available data, the relaxation parameter (e.g., T1, T2) values, and the fit needed to make a particular diagnosis. For example, a first diagnosis may require a first number of data points for validity while a second diagnosis may require a second, different, and greater number of data points for validity.

In different examples, an acceptable error range may be pre-determined or may be based on the echo signals. A pre-determined error range may be appropriate for certain analyses and diagnoses while an on-the-fly error range may be appropriate for other analyses and diagnoses. In an embodiment where the error range depends on the echo signals the dependency may be controlled by the amount of noise in the signal. A data set that is relatively noise free may have a more narrow acceptable error range while a data set that is relatively noisy may be forced to accept a wider acceptable error range. Identifying the error range and the rationale for its establishment may provide information upon which the decision to make a diagnosis and/or the confidence for a diagnosis may be made.

To analyze different self-justification approaches, phantom studies were performed on a 1.5T MRI system with a 12-channel head coil. One T2-mapping study employed a multiple contrast phantom (T2 ranges from 35 to 1076 ms) and a conventional Spin-Echo Multiple Contrast (SE-MC) sequence. Reference imaging parameters were: FOV=180 mm, slices=3, thickness=3.0 mm with gap=6 mm, matrix=256×256, phase=LR, partial FT=⅝, TR=2000 ms, BW=225 Hz/pixel, NEX=1, and 8 echoes with TE=13.7, 27.4, 41.1, 54.8, 68.5, 82.2, 95.9, 109.6 ms, respectively. T2-maps were calculated using linear and/or non-linear fitting.

Figure 4:
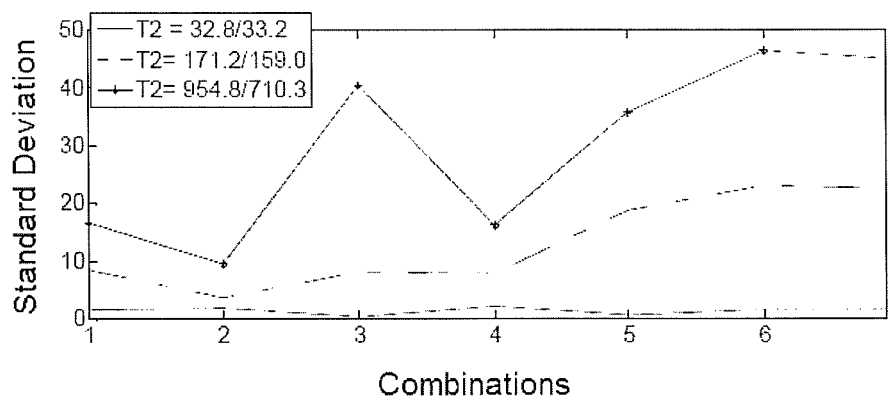
FIG. 4 illustrates standard deviations for decay curves associated with conventional fitting processes and illustrates standard deviations for decay curves associated with example self-justification fitting processes.

FIG. 4 shows standard deviations calculated from seven echo combinations. The standard deviation is divided by 10 for display purposes when T2=710 ms. The second combination, which excludes the first two echoes, has a minimum standard deviation when T2=710 ms and 159 ms. In FIG. 4, the standard deviations are lower than 2 when T2=33 ms and the minimum standard deviation is obtained when the last echo, which may have been affected by noise, is excluded from fitting. Thus, in this example, dropping a single data point, the last echo, is shown to yield improved curve fitting.

The effects of non-ideal system performance may vary between different tissues. Species with shorter relaxation times appear to be more susceptible to factors that decrease the signal to noise ratio (SNR) while species with longer relaxation times appear to be more sensitive to system imperfections. Independent of the physics or circumstances behind susceptibility, data points that compromise fit can be identified and excluded.

At this point it may be appropriate to revisit some fundamental basics of NMR to understand where self-justification fitting for MRI relaxation parameter quantification can fit in. Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

In the presence of a magnetic field, some of the spins will align in one direction (e.g., N/S) with respect to that magnetic field while other spins will align in an opposite direction (e.g., S/N) with respect to that magnetic field. MRI manipulates the magnetic field so that a net alignment in one direction is achieved. MRI further manipulates the magnetic field so that local differences in the field are achieved to allow spatial encoding. For example, x, y, and z gradients may be applied to create local variations in the larger magnetic field. The local variations allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located.

With the local variations created, RF energy may be applied to selected sets of spins associated with a local variation to make those spins behave in a certain way. For example, spins may be forced into a high energy state and forced away from their default alignment. When the RF energy is removed, the spins may return or may be forced to return to their default alignment. Different spins may return to their default alignment at different rates. Conventionally, information about these different relaxations has been used to make images. Rather than acquire data from which an image can be made, quantification based approaches seek to acquire data from which a relaxation parameter can be quantified.

Spins may return to their default alignment for different reasons. As the spins return from the forced alignment to the natural alignment, the spins produce a signal that can be detected for a short period of time. Conventional systems are limited by this short period of time and must, therefore, constantly repeat the process that tips the spins out of one alignment and into another alignment from which they can return and produce signal.

Like conventional MRI, quantitative NMR approaches manipulate the magnetic field and manipulate the application of RF energy at different frequencies. Unlike imaging approaches, quantitative approaches may employ a comprehensive inquisitive signal acquisition approach that acquires data useful for quantifying a relaxation parameter. In one embodiment, a quantitative NMR approach employs pseudo-random routines that allow a volume to produce the signal(s) the volume is going to produce in response to a variety of changing conditions created by a variety of changing applications of RF energy. This quantitative approach then compares a signal that evolves from the received signals to known signals received from other acquisitions at other times under similar conditions or to a set of simulated expected or predicted curves. The comparing may involve curve fitting.

If the received signal evolution matches or can be fit to within a threshold of a known, simulated, or predicted signal evolution, then the volume that generated the signal evolution likely holds the same number, type, and mixture of spins as the volume that produced that known signal evolution. If relaxation parameters are available for the known, simulated, or predicted signal evolution, then conventional relaxation parameter determinations may be skipped. In one example, the quality of the fit depends on the quality of the signal evolution which, in turn, depends on the quality of the data points included for the fit. Thus, self-justification fitting for MRI relaxation parameters can facilitate improving the performance of quantification based NMR techniques.

Using pattern matching to compare acquired signal evolutions to known signal evolutions may include analyzing a cross-correlation between signal evolutions of different tissues acquired using RF sequence blocks having different parameters. Ideally, a signal evolution would fit to exactly one member of the multi-dimensional set of known evolutions. The odds of having one exact fit, or of having any fit at all, may depend on the quality of the signal evolution curve being input into the system. Using self-justification may improve the quality of the input curve. In computer science the phrase "garbage in garbage out" is often used to describe the relationship between the quality of data provided to a computer program and the quality of output the computer program produces. Self-justification fitting for MRI relaxation parameters may increase the quality of the input data and thus in turn increase the quality of the output data.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a volume 100 (e.g., voxel) that contains two resonant species R1 and R2. R1 and R2 may have different relaxation parameters. For example, the $T1_{R1}$ may be less than $T1_{R2}$ while $T2_{R1}$ may be greater than $T2_{R2}$. Conventional systems may acquire a T1 weighted image and then acquire a T2 weighted image and then register the images. Example apparatus and methods are concerned with improving, through self-justification, data that may be acquired for a quantitative-based system.

In one embodiment, a quantitative based system may not be constrained to acquire T1 and then T2 weighted images in serial. Instead, a quantitative based system may perform a series of varied RF sequence blocks that cause volume 100 to simultaneously produce different NMR signals from both R1 and R2. A signal evolution can be produced from these simultaneously produced different NMR signals. Relaxation parameters (e.g., T1, T2) can be determined from the signal evolution through pattern matching to other signal evolutions for which relaxation parameters are known. The resonant species R1 and R2 can then be characterized by the relaxation parameters. The quality of the characterization may depend, at least in part, on the quality of the data input to the pattern matching process.

Self-justification fitting, which may exclude out-lying or potentially compromised data points, facilitates improving the quality of the input data and thus the quality of the characterization. While a sample with multiple resonant species is illustrated, and while data that depends on multiple relaxation parameters is described, one skilled in the art will appreciate that self-justification fitting may also be applied to other signals including associated with a single resonant species and a single relaxation parameter.

Figure 2:
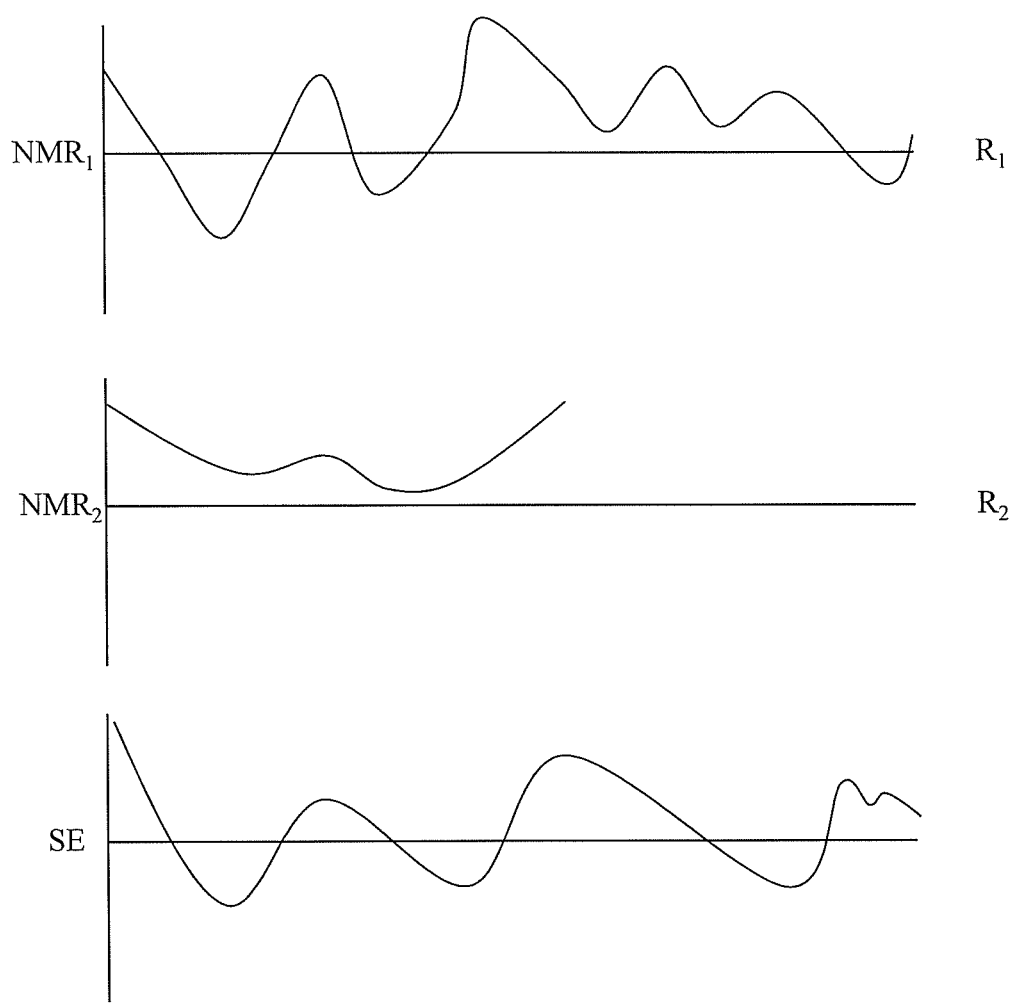
FIG. 2 illustrates two individual NMR signals received from two resonant species and a signal evolution derived from the two individual NMR signals.

FIG. 2 illustrates plots of two individual NMR signals $NMR_1$ and $NMR_2$ received from the two resonant species R1 and R2 in volume 100. $NMR_1$ includes data points generated by R1 under different conditions at different times. $NMR_2$ includes data points generated by R2 under the different conditions at the different times. Signal evolution SE results from $NMR_1$ and $NMR_2$ being generated and acquired simultaneously. The space from which the data points for $NMR_1$ and $NMR_2$ is acquired may be referred to as a (k, t, E) space, where in different examples, E refers to (T1, T2, D), (T1, T2, D, . . . ), where D refers to diffusion relaxation. In one example, both t and E may be non-linear. In another example, both t and E may be pseudo-random. Once again, while two plots associated with two resonant species are illustrated, one skilled in the art will appreciate that a volume may include a greater or lesser number of resonant species and thus may produce a greater or lesser number of signals.

Ideally, all the data points in $NMR_1$ and $NMR_2$ would be valid, noise-free data points that were unaffected by any system imperfections. While this is theoretically possible, it is unlikely. Thus, self-justification fitting may be employed to identify data points that have an unacceptable influence on fitting attributes (e.g., standard deviation).

FIG. 3 and FIG. 4 are described above. These figures illustrate results from one test that reveals superior curve fitting when self-justification fitting is employed.

Figure 5:
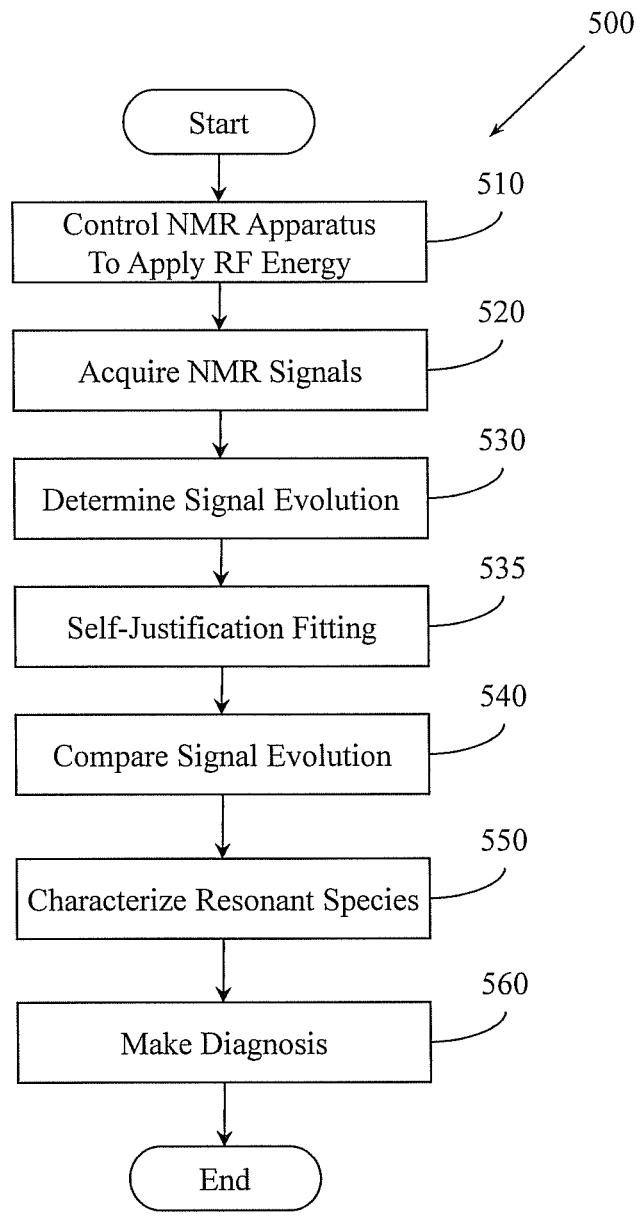
FIG. 5 illustrates a method associated with self-justification fitting associated with quantifying an MRI relaxation parameter.

FIG. 5 illustrates a method 500 associated with self-justification fitting for MRI relaxation parameter quantification. Method 500 includes, at 510, controlling an MRI apparatus to take actions that result in an NMR signal being produced from an object to which RF energy is applied. In conventional image-based MRI, a signal that depends on a single relaxation parameter is desired and required to facilitate imaging. In some quantification based approaches, a potentially richer signal may be retrieved. The potentially richer signal may depend on two or more relaxation parameters. Acquiring signals with greater information content facilitates producing more distinct signal evolutions that are more likely to be distinctly matched. However, acquiring signals with greater information content may also increase the likelihood that at least one data point may be a compromised outlier that can negatively impact fitting. Thus, self-justification fitting may be employed to "clean" the richer data signal to enhance matching. Once again, self-justification fitting may be employed with conventional signals, but may find additional value when employed with larger, more content-rich signals.

Method 500 also includes, at 520, controlling the NMR apparatus to acquire NMR signals. In conventional image based systems, the time during which an imaging-relevant NMR signal can be acquired is severely limited (e.g., 4-5 seconds). In quantification based approaches, the NMR apparatus may be controlled to acquire NMR signal for significantly longer periods of time. For example, the NMR apparatus may be controlled to acquire signal for up to ten seconds, for up to twenty seconds, for up to one hundred seconds, or even longer. Since the signal may be acquired for significantly longer periods of time, this may increase the likelihood that an individual data point may be compromised or otherwise affected to the point where it produces an unacceptable impact on fitting. Self-justification fitting may facilitate identifying and handling this outlying data point. Although longer acquisition times and increased signal content are described, one skilled in the art will appreciate that self-justification fitting may be employed even with conventional systems and conventional data sets.

Method 500 also includes, at 530, controlling the NMR apparatus to determine a signal evolution from the acquired NMR signals. Determining the signal evolution may include storing (k, t, E) space data points acquired during action 520. While an individual sequence block may yield a single point in (k, t, E) space, the signal evolution in a quantification based approach may be determined over a series of variable RF sequence blocks. Once again, acquiring a greater amount of data, where that data has a richer signal content, may increase the likelihood that an undesirable data point may be introduced.

Method 500 also includes, at 535, performing self-justification fitting. Performing the self-justification fitting may include selectively excluding data points that have an undesired effect on a fit between the input data and data to which the input data is being compared.

Method 500 also includes, at 540, controlling the NMR apparatus to compare a computed signal evolution to one or more known, stored, simulated, and/or predicted signal evolutions. In different examples, the "stored" signal evolutions may include previously acquired signals, simulated signals, or both. The stored signals may be associated with a potentially very large data space. Thus, one skilled in the art will appreciate that the stored signal evolutions may include signals outside the set of signal evolutions characterized by:

$$SE = A - Be^{-t/C}$$

where:
SE is a signal evolution,
A is a constant,
B is a constant,
t is time, and
C is a single relaxation parameter.

Indeed, one skilled in the art will appreciate that the very large data space for the stored signal evolutions can be partially described by:

$$SE = \prod_{i=1}^{N_A} \sum_{j=1}^{N_{RF}} R_i(\alpha) R_{RFij}(\alpha, \varphi) R(G) E_i(T1, T2, D)$$

where:
SE is a signal evolution,
$N_A$ is a number of RF sequence blocks,
$N_{RF}$ is a number of RF pulses in an sequence block,
α is a flip angle,
φ is a phase angle,
$R_i(\alpha)$ is a rotation due to off resonance,
$R_{RFij}(\alpha,\phi)$ is a rotation due to RF differences,
R(G) is a rotation due to a gradient,
T1 is spin-lattice relaxation,
T2 is spin-spin relaxation,
D is diffusion relaxation, and
$E_i(T1,T2,D)$ is decay due to relaxation differences.

While $E_i(T1,T2,D)$ is provided as an example, one skilled in the art will appreciate that $E_i(T1,T2,D)$ may actually be $E_i(T1, T2, D, \ldots)$. Thus, self-justification fitting of MRI relaxation parameters may include fitting for T1, T2, D, and/or others.

In one example, the summation on j could be replaced by a product on j.

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment $R_i(\alpha)$, $R_{RFij}(\alpha,\phi)$, and R(G) may be viewed as Bloch equations.

While performing self-justification fitting at 535 and comparing signal evolutions at 540 are illustrated as separate actions, in one embodiment, self-justification fitting and signal evolution comparisons may be interleaved as points are added or dropped from a data set, may cycle around as points are added or dropped from a data set, may be performed in parallel, and may be performed in other inter-dependant ways.

Method 500 also includes, at 550, characterizing a resonant species. Characterizing a resonant species may include, for example, identifying relaxation parameters including, but not limited to, T1 relaxation associated with the resonant species, T2 relaxation associated with the resonant species, off-resonance relaxation associated with the resonant species, proton density relaxation, and diffusion weighted relaxation associated with the resonant species. Thus, in different embodiments, self-justification fitting may be applied to quantification based approaches for determining relaxation parameters including, but not limited to, T1 relaxation, T2 relaxation, off-resonance relaxation, and diffusion weighted relaxation.

Method 500 also includes, at 560, making a diagnosis. Making a diagnosis may include, for example, identifying specific condition and/or disease signatures.

While FIG. 5 illustrates various actions occurring in serial, it is to be appreciated that various actions illustrated in FIG. 5 could occur substantially in parallel. By way of illustration, a first process could control applying RF energy, a second process could control acquiring NMR signals and determining a signal evolution, a third process could perform self-justification fitting, a fourth process could perform signal evolution comparisons, and other processes could characterize and/or diagnose. While several processes are described, it is to be appreciated that a greater and/or lesser number of processes could be employed.

In different quantification-based embodiments, the NMR apparatus may be configured to apply RF energy according to a series of variable RF sequence blocks using a TrueFISP pulse sequence, a FLASH pulse sequence, a SE or TSE pulse sequence, or other pulse sequence. A set of RF sequence blocks is not necessarily the same thing as a conventional imaging-based pulse sequence. An RF sequence block differs from a conventional pulse sequence for at least the reason that non-linearly varying Δt and ΔE, which produce NMR signals in (k, t, E) space having non-constant amplitudes and phases are encouraged, not prohibited. Once again this may increase the size and richness of the set of data acquired in response to the application of the RF energy. Increasing the size and richness of the data set may increase the likelihood that an outlying or compromised data point may have undue and unwanted influence on a fit. Self-justification fitting may mitigate the impact of an outlying or compromised data point.

Figure 6:
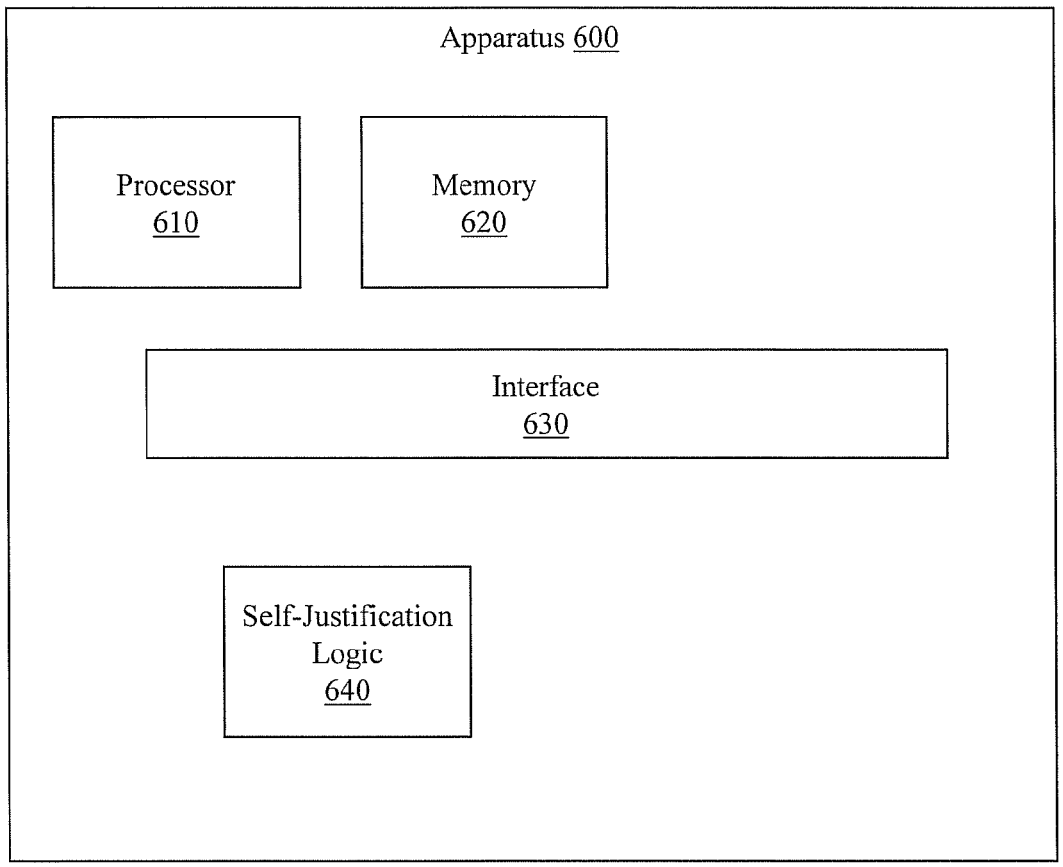
FIG. 6 illustrates an apparatus associated with self-justification fitting associated with quantifying an MRI relaxation parameter.

FIG. 6 illustrates an apparatus 600. Apparatus 600 includes a processor 610, a memory 620, an interface 630, and a self-justification logic 640. The memory 620 may be configured to store a set of data points associated with an NMR signal evolution. The interface 630 is configured to connect the processor 610, the memory 620, and the self-justification logic 640.

In one embodiment, the self-justification logic 640 is configured to select a subset of data points from the set of data points as a function of fitting at least two different subsets of data points from the set of data points to a known NMR signal evolution.

Figure 7:
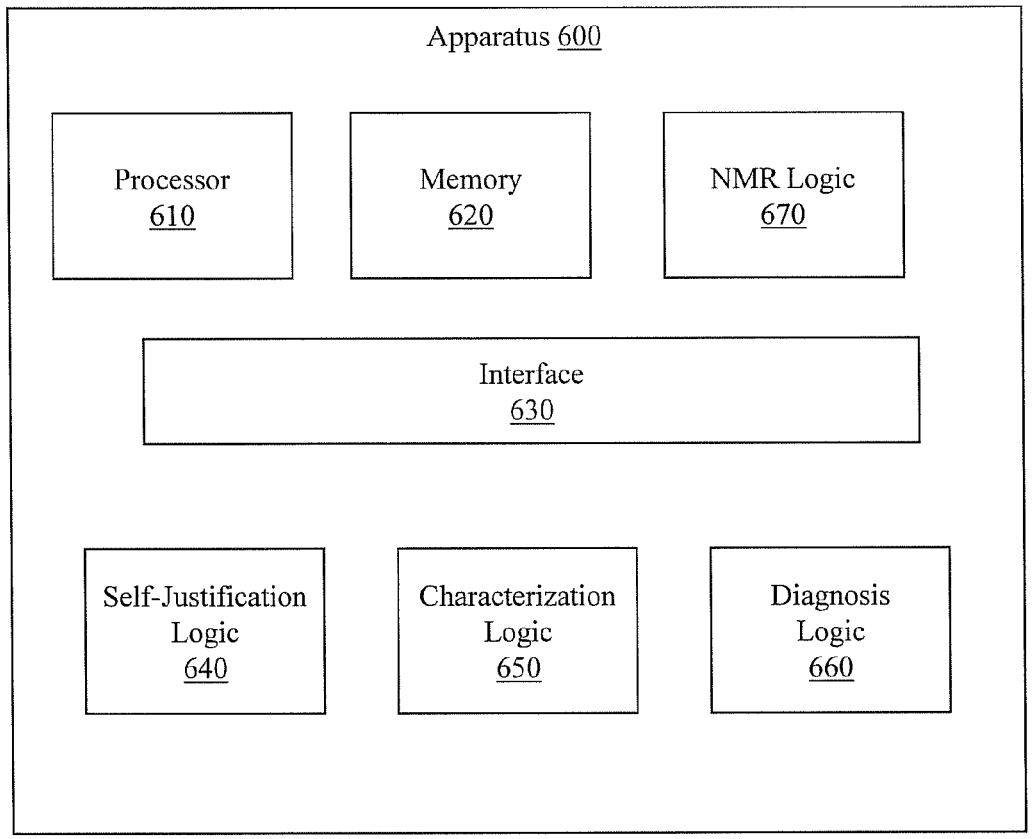
FIG. 7 illustrates an apparatus associated with self-justification fitting associated with quantifying an MRI relaxation parameter.

FIG. 7 illustrates another embodiment of apparatus 600 (FIG. 6). This embodiment includes an NMR logic 670, a characterization logic 650, and a diagnosis logic 660. In one embodiment, the NMR logic 670 is configured to repetitively and variably sample a (k, t, E) space associated with an object to acquire a set of NMR signals. Members of the set of NMR signals are associated with different points in the (k, t, E) space, where t is time and E includes at least T1 spin-lattice relaxation, T2 spin-spin relaxation, X off-resonance relaxation, Y spin density relaxation, and D diffusion relaxation. In one example, one or more of, t, and E may vary non-linearly. The NMR logic 670 may also be configured to produce an NMR signal evolution from the set of NMR signals.

In one embodiment, the characterization logic 650 is configured to characterize one or more of T1, T2, X, Y, and D for a resonant species in the object based, at least in part, on comparing an NMR signal evolution associated with the selected subset of data points to the known NMR signal evolution. More generally, characterization logic 650 is configured to characterize a resonant species in the object by comparing the NMR signal evolution to a characterizing signal evolution(s). Characterizing the resonant species may include identifying relaxation parameters including, but not limited to, T1 relaxation, T2 relaxation, diffusion weighted relaxation, and off-resonance relaxation. The characterizing signal evolution(s) may be stored in a library of characterizing signal evolutions. The relaxation parameter identification may be enhanced as a result of the self-justification fitting performed by self-justification logic 640.

In one embodiment, the diagnosis logic 660 is configured to make a diagnosis associated with the object based, at least in part, on comparing an NMR signal evolution associated with the selected subset of data points to the known NMR signal evolution. More generally, diagnosis logic 660 is configured to diagnose a condition by, for example, comparing the NMR signal evolution to a characterizing signal evolution (s). Making the diagnosis may include identifying relaxation parameters including, but not limited to, T1 relaxation, T2 relaxation, diffusion weighted relaxation, and off-resonance relaxation. The diagnosis may be enhanced as a result of the self-justification fitting performed by self-justification logic 640.

Figure 8:
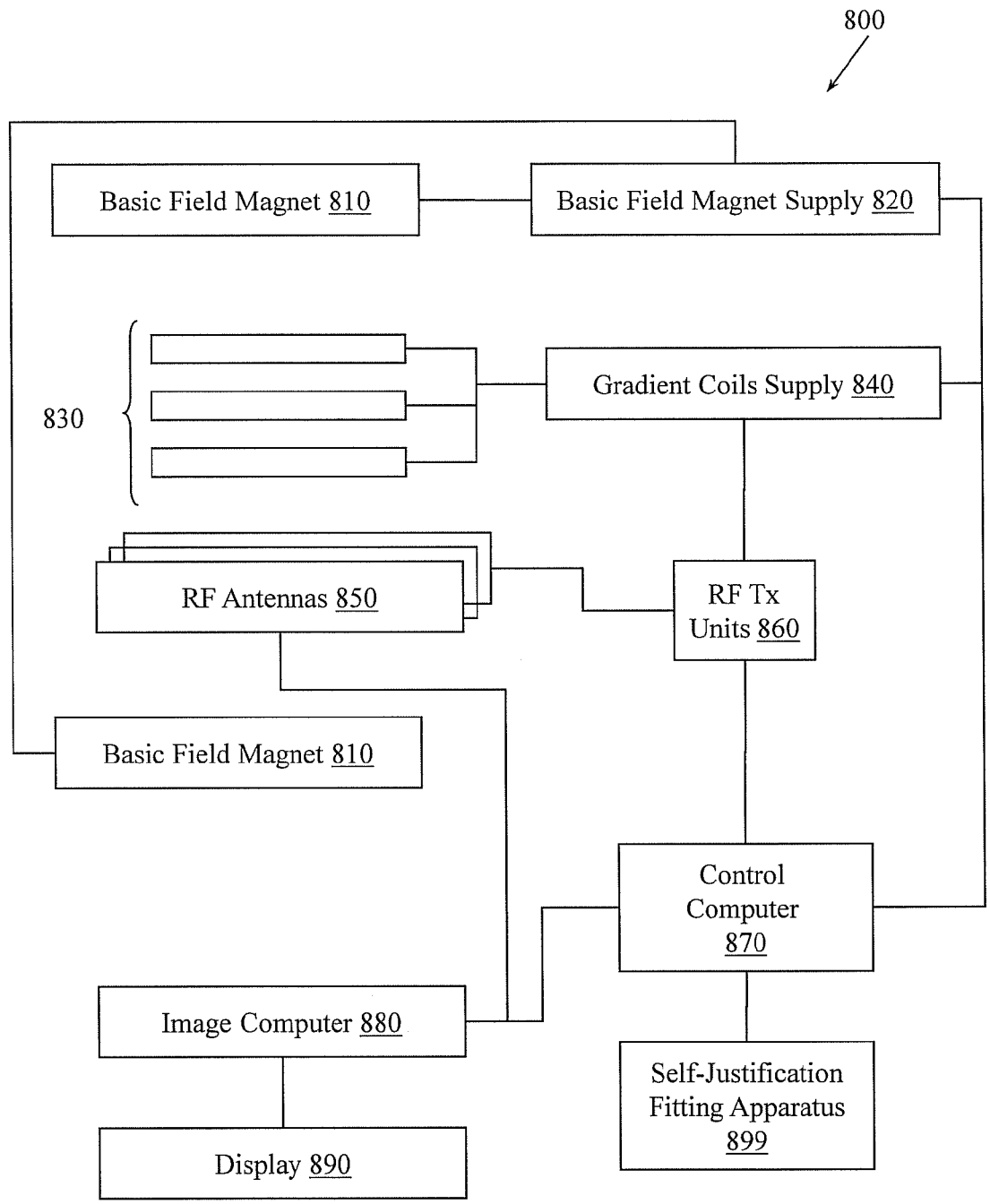
FIG. 8 illustrates an MRI apparatus configured to perform self-justification fitting associated with quantifying an MRI relaxation parameter.

FIG. 8 illustrates an example MRI apparatus 800 configured with a self-justification apparatus 899 to facilitate self-justification fitting employed, for example, in MRI relaxation parameter quantification. The self-justification apparatus 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MRI procedure.

MRI apparatus 800 may include a set of RF antennas 850 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890. However, in quantification based approaches, the RF energy applied to an object by apparatus 800 need not be constrained to produce signals with substantially constant amplitudes or phases. Instead, received signals may be matched to known signals for which a reconstruction, relaxation parameter, or other information is already available. This facilitates producing a quantitative result. In this example, no transformation may be made.

While FIG. 8 illustrates an example MRI apparatus 800 that includes various components connected in various ways, it is to be appreciated that other MRI apparatus may include other components connected in other ways.

Figure 9:
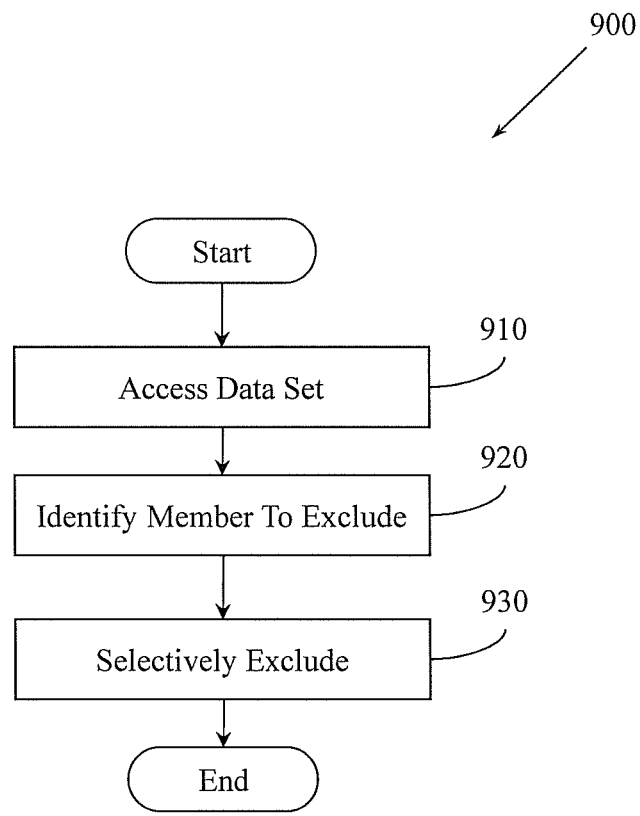
FIG. 9 illustrates a method associated with self-justification fitting associated with quantifying an MRI relaxation parameter.

FIG. 9 illustrates a method 900. Method 900 includes, at 910, accessing a data set comprising two or more data points associated with an NMR signal received from an object. The NMR signal may have been produced in response to an NMR apparatus applying RF energy to a volume in the object. The NMR apparatus may have acquired the data set from NMR signals produced as a result of applying the RF energy to the volume.

Method 900 also includes, at 920, identifying a member of the data set to be excluded when determining a candidate signal evolution associated with the NMR signal. In one embodiment, identifying the member at 920 includes examining an impact the member has on a fit attribute associated with a fit of the candidate signal evolution to a comparison signal evolution. The fit attribute may be, for example, a standard deviation. The fit may include, for example, comparing curves described by the data set to curves including a stored, known, or simulated curve.

Identifying the member of the data set to exclude may be based, at least in part, on the effect the member has on a quantification range and/or error range for the data set. Thus, in one embodiment, method 900 may also include providing a quantification range and/or error range associated with the data set. The quantification range and/or error range may be associated with the manipulated data set after a point(s) has been excluded. To facilitate identifying the impact of different data points being included or excluded, in one embodiment method 900 may be configured to provide a first quantification range associated with the data set with the member included and to provide a second quantification range associated with the data set with the member excluded. In one embodiment, the data set with the more desirable quantification range may be selected. Similarly, method 900 may be configured to provide a first error range associated with the data set with the member included and to provide a second error range associated with the data set with the member excluded. Once again, the data set with the more desirable error range may be selected for subsequent processing.

Method 900 also includes, at 930, selectively excluding the member of the data set when determining the signal evolution. Excluding the member of data set may be a physical or logical operation. A physical exclusion may include, for example, deleting the data point, moving the data point to an excluded data structure, and so on. A logical exclusion may include, for example, associating an exclusion signal with the data point, removing an "included" signal associated with the data point, reconfiguring a pointer, reconfiguring a data structure, and so on. Since multiple different views of the data set may be examined, logical exclusion may be employed.

After having performed self-justification fitting that manipulates the data set, the manipulated data set may be used to perform additional actions. For example, method 900 could continue by characterizing an NMR relaxation parameter associated with a portion of the object. The characterization could be based on the fit of the candidate signal evolution to the comparison signal evolution. For example, a fit between a signal evolution produced from the manipulated data set that agrees to within a pre-determined tolerance comparison with a known signal evolution may allow identifying relaxation parameters that were known to produce the known signal evolution. The NMR relaxation parameter may be, for example, T1 relaxation, T2 relaxation, off-resonance relaxation, spin density relaxation, and/or diffusion weighted relaxation.

As described above, the data that is being subjected to self-justification fitting may be associated with richer signal contents than conventional data. Thus, the comparison signal evolution may be outside the set of signal evolutions characterized by:

$$SE = A - Be^{-t/C}$$

Where SE is a signal evolution, A is a constant, B is a constant, t is time, and C is a single relaxation parameter. Instead, the comparison signal evolution may be described by:

$$SE = \prod_{i=1}^{N_A} \sum_{j=1}^{N_{RF}} R_i(\alpha) R_{RFij}(\alpha, \varphi) R(G) E_i(T1, T2, D)$$

where SE is a signal evolution, $N_A$ is a number of RF sequence blocks, $N_{RF}$ is a number of RF pulses in an sequence block, $\alpha$ is a flip angle, $\phi$ is a phase angle, $Ri(\alpha)$ is a rotation due to off resonance, $R_{RFij}(\alpha,\phi)$ is a rotation due to RF differences, R(G) is a rotation due to a gradient, T1 is spin-lattice relaxation, T2 is spin-spin relaxation, and $E_i$(T1,T2,D) is decay due to relaxation differences associated with one or more of, T1 relaxation, T2 relaxation, off-resonance relaxation, spin density relaxation, and diffusion weighted relaxation.

Figure 10:
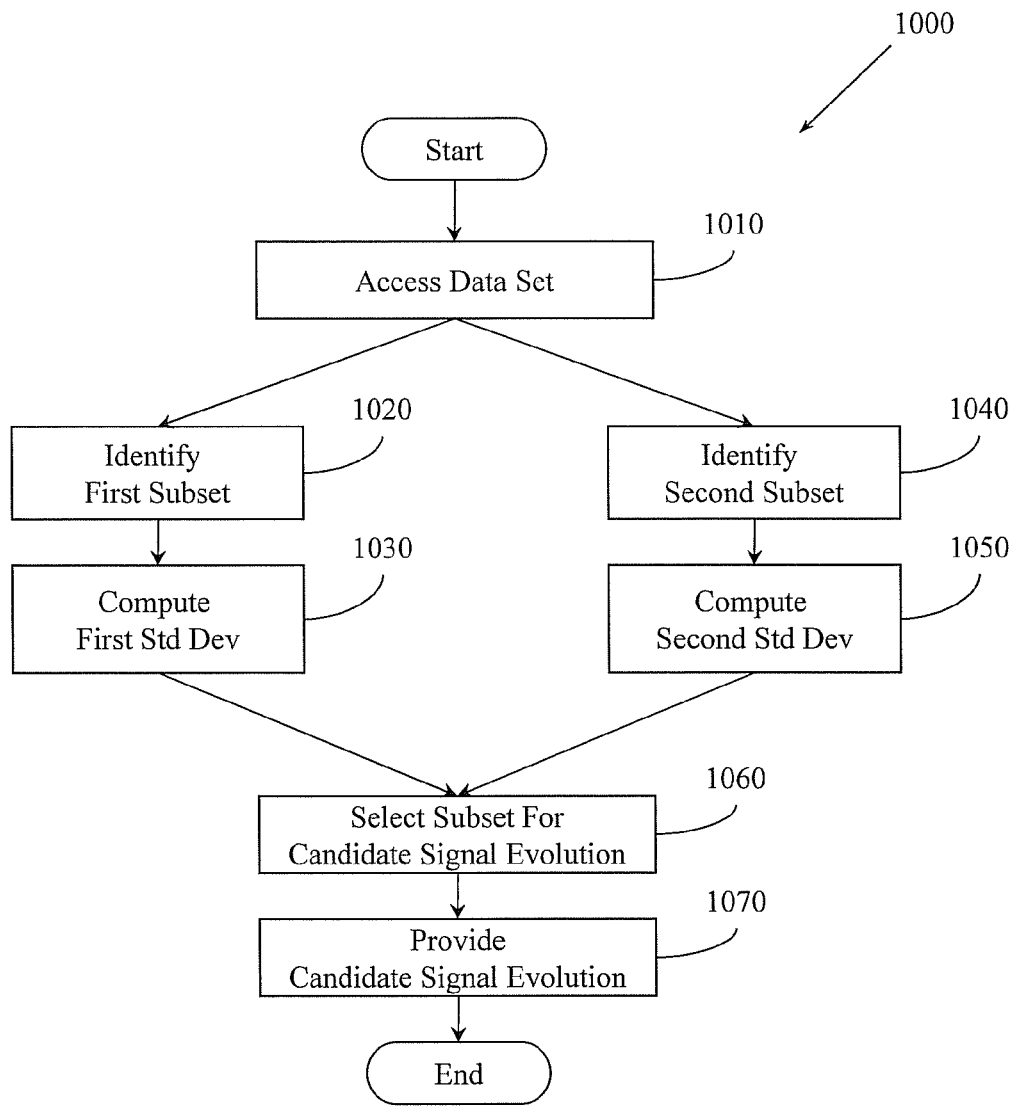
FIG. 10 illustrates a method associated with self-justification fitting associated with quantifying an MRI relaxation parameter.

FIG. 10 illustrates a method 1000. Method 1000 includes, at 1010, accessing a data set comprising two or more data points associated with an NMR signal received from an object. Accessing a data set may include, for example, receiving a data set, acquiring a data set, receiving a pointer to a data set, receiving an identifier that facilitates locating a data set, mounting a storage device on which the data set is recorded, receiving the data set as a complete unit, receiving members of the data set, and so on. In one example, the NMR signal may be a signal received in response to a conventional NMR technique or pulse sequence. In another example, the NMR signal may be a signal having richer content than a signal received in response to a conventional NMR technique or pulse sequence. For example, the signal having richer content may depend on two relaxation parameters simultaneously.

Method 1000 also includes, at 1020, identifying a first subset of data points from the data set and, at 1040, identifying a second subset of data points from the data set. In one example, the first subset and the second subset are pre-determined subsets. For example, a first subset may be the first half of the data and the second subset may be the second half of the data. In another example, the first subset may hold a first series of data points (e.g., 1, 3, 5, 7, 9, . . . ) and the second subset may hold a different series of data points (e.g., 2, 4, 6, 8, 10, . . . ). In one example, the first subset and second subset are ad-hoc subsets whose membership may be computed on-the-fly.

Method 1000 also includes, at 1030, computing a first standard deviation associated with fitting a first signal evolution associated with the first subset of data points to a comparison signal evolution and, at 1050, computing a second standard deviation associated with fitting a second signal evolution associated with the second subset of data points to the comparison signal evolution.

Method 1000 also includes, at 1060, selecting either the first subset or the second subset to determine a candidate signal evolution based, at least in part, on comparing the first standard deviation and the second standard deviation. While standard deviation is described, more generally a value or values (e.g., confidence interval) computed from the two fits may be compared.

Method 1000 also includes, at 1070, providing a signal evolution computed from the selected subset. Since the selected subset may exhibit improved fit attributes, the signal evolution computed from the selected subset may yield a better downstream result, mitigating the effects of garbage-in-garbage-out.

In one embodiment, method 1000 may also include characterizing an NMR relaxation parameter associated with a portion of the object based on a fit of the candidate signal evolution to a comparison signal evolution. The relaxation parameter can include, but is not limited to, T1 relaxation, T2 relaxation, off-resonance relaxation, spin density relaxation, and diffusion weighted relaxation.

Since a diagnosis may be made on the characterization, data that facilitates understanding the confidence in the characterization may be provided. Thus, in one embodiment, method 1000 may be configured to provide a quantification range associated with the data set, and/or an error range associated with the data set.

As illustrated, various portions of method 1000 may be performed in parallel. While "in parallel" is mentioned, "substantially in parallel" or other pseudo-parallel techniques may be employed. However, when true parallel processing (e.g., multiple processors) is available, then true parallel processing may be employed. While two subsets and two standard deviations are illustrated, in one embodiment more than two subsets may be identified and more than two standard deviations may be computed.

Figure 11:
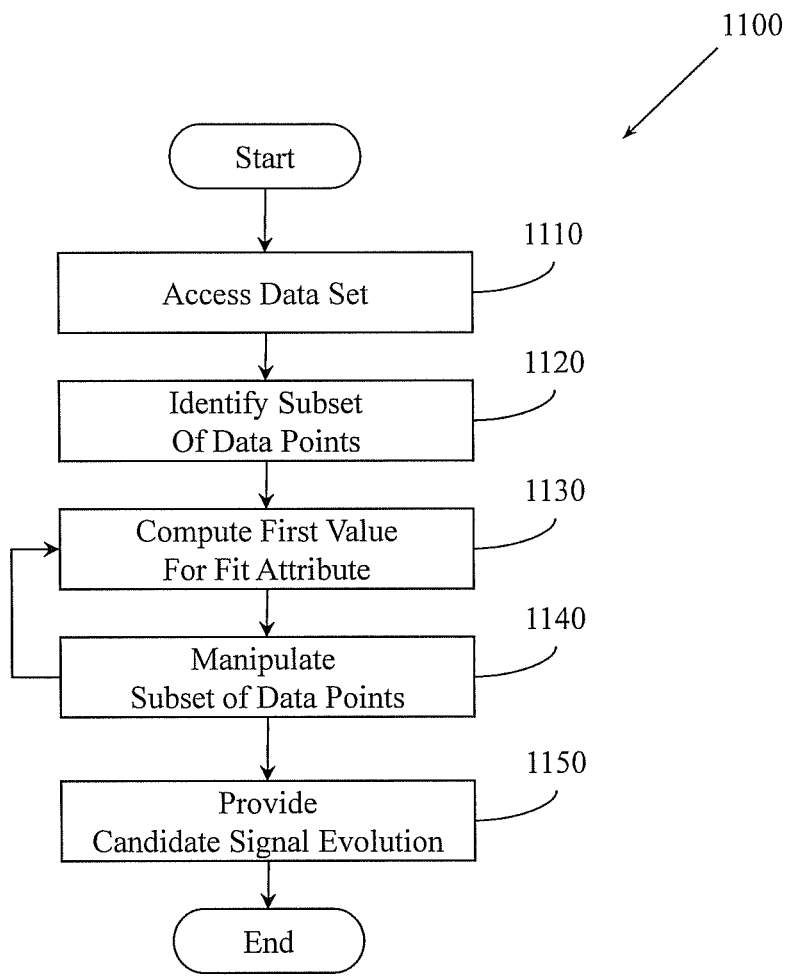
FIG. 11 illustrates a method associated with self-justification fitting associated with quantifying an MRI relaxation parameter.

FIG. 11 illustrates a method 1100. Method 1100 includes, at 1110, accessing a data set. The data set may include two or more data points associated with a signal received from an object that has been excited using NMR.

Method 1100 also includes, at 1120, identifying a first subset of data points from the data set. Identifying the first subset may include physically copying points from the data set to the subset, logically copying points from the data set to the subset, establishing a physical data structure into which the subset is placed, establishing or manipulating a logical data structure into which the subset is placed, and so on. In one embodiment, different subsets may be pre-determined to facilitate providing adequate overlap and orthogonality in candidate subsets being analyzed.

Method 1100 also includes, at 1130, computing a first value for a fit attribute associated with fitting a first signal evolution associated with the first subset of data points to a comparison signal evolution. Fitting the first signal evolution to the comparison signal evolution may include matching techniques including, but not limited to, orthogonal matching pursuit, regression analysis, and least squares fitting.

Method 1100 also includes, at 1140, selectively manipulating the first subset of data points as a function of the first value for the fit attribute. Manipulating the first subset at 1140 can include adding data points to the subset or removing data points from the subset. In one embodiment, a data point will be added to the first subset to form a second subset upon determining that a second value for the fit attribute associated with fitting a second signal evolution associated with the second subset to the comparison signal evolution is acceptable. Being acceptable may include improving the value for the fit, not degrading the value for the fit beyond a threshold, only changing the value for the fit by a certain amount, and so on. In another embodiment, a data point will be subtracted from the first subset to form a second subset upon determining that a second value for the fit attribute associated with fitting a second signal evolution associated with the second subset to the comparison signal evolution is acceptable. Thus, approaches that start with a complete set and remove offensive data points until an acceptable fit is achieved may be employed. Similarly, approaches that start with a minimal data set and that add data points so long as an acceptable fit can be maintained may also be employed. In different examples, adding and removing data points may continue until all points have been considered, until all combinations of points have been considered, until a threshold number of points have been considered, until a threshold number of combinations have been considered, until an acceptable fit attribute has been achieved, until an acceptable quantification range has been achieved, until an acceptable error range has been received, and so on. Thus FIG. 11 illustrates a loop possibility from 1140 to 1130. One skilled in the art will appreciate that other loop possibilities may be employed.

After the desired subset is found, method 1100 may proceed, at 1150, to provide a candidate signal evolution associated with the subset. The candidate signal evolution may then be employed for characterizing relaxation parameters, diagnosing a condition, and so on. To facilitate evaluating the quality of the characterization, diagnosis, or so on, method 1100 may also provide a quantification range associated with the subset, and/or an error range associated with the first subset. The error range may describe, for example, the largest predicted error encountered when the manipulated data set is employed, the smallest predicted error encountered when the manipulated data set is employed, the average predicted error encountered when the manipulated data set is employed, and so on. Similarly, the quantification range may describe, for example, the largest predicted or experienced quantification error encountered when the manipulated data set is employed, the smallest predicted or experienced quantification error encountered when the manipulated data set is employed, the average predicted or experienced quantification error encountered when the manipulated data set is employed, and so on.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
accessing a data set comprising two or more data points associated with a nuclear magnetic resonance (NMR) signal received from an object;
selectively identifying a member of the data set to be excluded when determining a candidate signal evolution associated with the NMR signal; and
selectively excluding the member of the data set when determining the signal evolution.

2. The method of claim 1, where selectively identifying the member comprises examining an impact the member has on a fit attribute associated with a fit of the candidate signal evolution to a comparison signal evolution.

3. The method of claim 2, where the fit attribute is a standard deviation.

4. The method of claim 2, comprising characterizing a nuclear magnetic resonance (NMR) relaxation parameter associated with a portion of the object based on the fit of the candidate signal evolution to the comparison signal evolution.

5. The method of claim 4, the NMR relaxation parameter being one or more of, T1 relaxation, T2 relaxation, off-resonance relaxation, spin density relaxation, and diffusion weighted relaxation.

6. The method of claim 1, comprising providing one or more of, a quantification range associated with the data set, and an error range associated with the data set.

7. The method of claim 1, comprising providing one or more of,
a first quantification range associated with the data set with the member included and providing a second quantification range associated with the data set with the member excluded, and
a first error range associated with the data set with the member included and providing a second error range associated with the data set with the member excluded.

8. The method of claim 1, where the two or more data points represent data associated with different echoes in a multi-echo echo train.

9. The method of claim 1, comprising controlling an NMR apparatus to apply radio frequency (RF) energy to a volume in the object, and
controlling the NMR apparatus to acquire the data set from NMR signals produced as a result of applying the RF energy to the volume.

10. The method of claim 2, where the comparison signal evolution is outside the set of signal evolutions characterized by:

$$SE = A - Be^{-t/C}$$

where:
SE is a signal evolution,
A is a constant,
B is a constant,
t is time, and
C is a single relaxation parameter.

11. The method of claim 2, where the comparison signal evolution is described by:

$$SE = \prod_{i=1}^{N_A} \sum_{j=1}^{N_{RF}} R_i(\alpha) R_{RFij}(\alpha, \varphi) R(G) E_i(T1, T2, D)$$

where:
SE is a signal evolution,
$N_A$ is a number of RF sequence blocks,
$N_{RF}$ is a number of RF pulses in an sequence block,
α is a flip angle,
φ is a phase angle,
Ri(α) is a rotation due to off resonance,
$R_{RFij}(\alpha,\phi)$ is a rotation due to RF differences,
R(G) is a rotation due to a gradient,
T1 is spin-lattice relaxation,
T2 is spin-spin relaxation, and
$E_i$(T1,T2,D) is decay due to relaxation differences associated with one or more of, T1 relaxation, T2 relaxation, off-resonance relaxation, spin density relaxation, and diffusion weighted relaxation.

12. A method, comprising:
accessing a data set comprising two or more data points associated with a nuclear magnetic resonance (NMR) signal received from an object;
identifying a first subset of data points from the data set;
identifying a second subset of data points from the data set;
computing a first standard deviation associated with fitting a first signal evolution associated with the first subset of data points to a comparison signal evolution;
computing a second standard deviation associated with fitting a second signal evolution associated with the second subset of data points to the comparison signal evolution; and
selecting either the first subset or the second subset to determine a candidate signal evolution based, at least in part, on comparing the first standard deviation and the second standard deviation.

13. The method of claim 12, comprising characterizing a nuclear magnetic resonance (NMR) relaxation parameter associated with a portion of the object based on a fit of the candidate signal evolution to a comparison signal evolution.

14. The method of claim 13, the NMR relaxation parameter being one or more of, T1 relaxation, T2 relaxation, off-resonance relaxation, spin density relaxation, and diffusion weighted relaxation.

15. The method of claim 12, comprising providing one or more of, a quantification range associated with the data set, and an error range associated with the data set.

16. The method of claim 12, where the first subset and the second subset are one or more of, pre-determined subsets, and ad-hoc subsets.

17. The method of claim 12, where two or more of, identifying the first subset, identifying the second subset, computing the first standard deviation, and computing the second standard deviation, are performed in parallel.

18. The method of claim 12, comprising controlling an NMR apparatus to apply radio frequency (RF) energy to a volume in the object, and
controlling the NMR apparatus to acquire the data set from NMR signals produced by the volume as a result of applying the RF energy to the volume.

19. The method of claim 12, where the two or more data points are associated with different echoes in a multi-echo echo train.

20. A non-transitory computer-readable medium storing computer-executable instructions that when executed by a computer control the computer to perform a method, the method comprising:
accessing a data set comprising two or more data points associated with a nuclear magnetic resonance (NMR) signal received from an object;
identifying a first subset of data points from the data set;
computing a first value for a fit attribute associated with fitting a first signal evolution associated with the first subset of data points to a comparison signal evolution; and
selectively manipulating the first subset of data points as a function of the first value for the fit attribute.

21. The non-transitory computer readable medium of claim 20, where selectively manipulating the first subset comprises adding a data point to the first subset to form a second subset upon determining that a second value for the fit attribute associated with fitting a second signal evolution associated with the second subset to the comparison signal evolution is acceptable.

22. The non-transitory computer readable medium of claim 20, where selectively manipulating the first subset comprises subtracting a data point from the first subset to form a second subset upon determining that a second value for the fit attribute associated with fitting a second signal evolution associated with the second subset to the comparison signal evolution is acceptable.

23. The non-transitory computer readable medium of claim 20, the method comprising providing a candidate signal evolution associated with the subset.

24. The non-transitory computer readable medium of claim 23, the method comprising characterizing an NMR relaxation parameter associated with a portion of the object based on a fit of the candidate signal evolution to the comparison signal evolution.

25. The non-transitory computer readable medium of claim 24, the NMR relaxation parameter being one or more of, T1 relaxation, T2 relaxation, off-resonance relaxation, spin density relaxation, and diffusion weighted relaxation.

26. The non-transitory computer readable medium of claim 20, the method comprising providing one or more of, a quantification range associated with the subset, and an error range associated with the first subset.

27. An apparatus, comprising:
a processor;
a memory configured to store a set of data points associated with a nuclear magnetic resonance (NMR) signal evolution;
a self-justification logic; and
an interface configured to connect the processor, the memory, and the self-justification logic,
the self-justification logic being configured to select a subset of data points from the set of data points as a function of fitting at least two different subsets of data points from the set of data points to a known NMR signal evolution.

28. The apparatus of claim 27, comprising:
an NMR logic configured to repetitively and variably sample a (k, t, E) space associated with an object to acquire a set of NMR signals, where members of the set of NMR signals are associated with different points in the (k, t, E) space, where t is time and E includes at least T1, T2, X, Y, and D, T1 being spin-lattice relaxation, T2 being spin-spin relaxation, X being off-resonance relaxation, Y being spin density relaxation, and D being diffusion relaxation, and where one or more of, t, and E, vary non-linearly; and a signal logic configured to produce an NMR signal evolution from the set of NMR signals.

29. The apparatus of claim 27, comprising a characterization logic configured to characterize one or more of, T1, T2, X, Y, and D for a resonant species in the object based, at least in part, on comparing an NMR signal evolution associated with the selected subset of data points to the known NMR signal evolution, where T1 is spin-lattice relaxation, T2 is spin-spin relaxation, X is off-resonance relaxation, Y is spin density relaxation, and D is diffusion relaxation.

30. The apparatus of claim 27, comprising a diagnosis logic configured to make a diagnosis associated with the object based, at least in part, on comparing an NMR signal evolution associated with the selected subset of data points to the known NMR signal evolution.

31. A method, comprising:
accessing a data set comprising two or more data points associated with a nuclear magnetic resonance (NMR) signal received from an object;
selectively identifying a weighting factor for a member of the data set to be applied when determining a candidate signal evolution associated with the NMR signal, where the weighting factor is a function of an impact the member has on a fit attribute associated with a fit of the candidate signal evolution to a comparison signal evolution; and
selectively weighting the member of the data set by the weighting factor when determining the signal evolution.

32. The method of claim 31, where the fit attribute is a standard deviation.

33. The method of claim 32, comprising characterizing a nuclear magnetic resonance (NMR) relaxation parameter associated with a portion of the object based on the fit of the candidate signal evolution to the comparison signal evolution.

34. The method of claim 33, the NMR relaxation parameter being one or more of, T1 relaxation, T2 relaxation, off-resonance relaxation, spin density relaxation, and diffusion weighted relaxation.

35. The method of claim 31, comprising providing one or more of, a quantification range associated with the data set, and an error range associated with the data set.

36. The method of claim 31, where the two or more data points represent data associated with different echoes in a multi-echo echo train.

37. The method of claim 31, comprising controlling an NMR apparatus to apply radio frequency (RF) energy to a volume in the object, and
controlling the NMR apparatus to acquire the data set from NMR signals produced as a result of applying the RF energy to the volume.

* * * * *